(12) United States Patent
Park et al.

(10) Patent No.: US 8,120,973 B2
(45) Date of Patent: Feb. 21, 2012

(54) WRITE DRIVER OF SEMICONDUCTOR MEMORY DEVICE

(75) Inventors: Mun-Phil Park, Gyeonggi-do (KR); Kwi-Dong Kim, Gyeonggi-do (KR); Sung-Ho Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 145 days.

(21) Appl. No.: 12/487,181

(22) Filed: Jun. 18, 2009

(65) Prior Publication Data

US 2010/0246296 A1 Sep. 30, 2010

(30) Foreign Application Priority Data

Mar. 25, 2009 (KR) .................. 10-2009-0025446

(51) Int. Cl.
*G11C 7/00* (2006.01)
(52) U.S. Cl. .................. 365/189.14; 365/189.16
(58) Field of Classification Search ........... 365/189.011, 365/189.14, 189.16, 189.17, 230.03
See application file for complete search history.

(56) References Cited

U.S. PATENT DOCUMENTS

| | | | | |
|---|---|---|---|---|
| 6,310,815 B1 * | 10/2001 | Yamagata et al. | ....... | 365/230.03 |
| 6,385,121 B2 * | 5/2002 | Lee | ........... | 365/230.03 |
| 7,151,713 B2 | 12/2006 | Nakazawa | | |
| 7,366,822 B2 | 4/2008 | Kwak et al. | | |
| 7,428,168 B2 * | 9/2008 | Kim | ......... | 365/185.13 |
| 7,508,731 B2 | 3/2009 | Park | | |
| 7,523,376 B2 | 4/2009 | Hsueh et al. | | |
| 7,633,827 B2 * | 12/2009 | Hidaka | ...... | 365/230.03 |
| 7,804,725 B2 * | 9/2010 | Lee et al. | ................ | 365/189.16 |

FOREIGN PATENT DOCUMENTS

| | | |
|---|---|---|
| JP | 2003-346497 | 12/2003 |
| KR | 1020080087440 | 10/2008 |
| KR | 1020080087441 | 10/2008 |

OTHER PUBLICATIONS

Notice of Preliminary Rejection issued from Korean Intellectual Property Office on Oct. 29, 2010.
Notice of Allowance issued from Korean Intellectual Property Office on May 31, 2011.

* cited by examiner

*Primary Examiner* — VanThu Nguyen
(74) *Attorney, Agent, or Firm* — IP & T Group LLP

(57) ABSTRACT

A semiconductor memory device includes a first memory bank and a second memory bank and a common write driver configured to drive write data to an activated memory bank of the first memory bank and the second memory bank. The common write driver of the semiconductor memory device includes a common write control block configured to generate common drive control signals corresponding to write data, and a common write drive block configured to drive transmission lines of a first memory bank or transmission lines of a second memory bank that are selected by a bank selection signal in response to the common drive control signals.

33 Claims, 6 Drawing Sheets

WRITE DRIVER OF SEMICONDUCTOR MEMORY DEVICE

CROSS-REFERENCE TO RELATED APPLICATIONS

The present application claims priority under 35 U.S.C. §119(a) to a Korean Patent Application No. 10-2009-0025446, filed in the Korean Intellectual Property Office on Mar. 25, 2009, which is incorporated herein by reference in its entirety.

BACKGROUND OF THE INVENTION

The present invention relates to semiconductor design technology, and more particularly, to a write driver of a semiconductor memory device.

Product costs are being reduced by decreasing an area occupied by internal circuits of a semiconductor memory device and thus producing a number of semiconductor memory devices with one wafer.

FIG. 1 illustrates a semiconductor memory device of the prior art.

Referring to FIG. 1, the semiconductor memory device includes a first memory bank, UPPER BANK, and a second memory bank, LOWER BANK, a plurality of first write drivers 11U, 12U, 13U and 14U for driving a multiplicity of write data DATA_IN0, DATA_IN1, DATA_IN2 and DATA_IN3 to the first memory bank, UPPER BANK, and a plurality of second write drivers 11L, 12L, 13L and 14L for driving the multiplicity of write data DATA_IN0, DATA_IN1, DATA_IN2 and DATA_IN3 to the second memory bank, LOWER BANK.

The plurality of first write drivers 11U, 12U, 13U and 14U and the plurality of second write drivers 11L, 12L, 13L and 14L are disposed in a column decoding area YDEC AREA between the first memory bank, UPPER BANK and the second memory bank, LOWER BANK. In the mean time, the first memory bank, UPPER BANK and the second memory bank, LOWER BANK are selectively activated by a bank selection signal and the write drivers corresponding to the activated memory bank drive the multiplicity of write data DATA_IN0, DATA_IN1, DATA_IN2 and DATA_IN3 to the activated memory bank.

The plurality of first write drivers 11U, 12U, 13U and 14U transfer the multiplicity of write data DATA_IN0, DATA_IN1, DATA_IN2 and DATA_IN3 to memory cells within the first memory bank, UPPER BANK through transmission lines U1, U2, U3 and U4 of the first memory bank, UPPER BANK. Meanwhile, the plurality of second write drivers 11L, 12L, 13L and 14L transfer the multiplicity of write data DATA_IN0, DATA_IN1, DATA_IN2 and DATA_IN3 to memory cells within the second memory bank, LOWER BANK through transmission lines D1, D2, D3 and D4 of the second memory bank, LOWER BANK. For reference, the transmission lines U1, U2, U3 and U4 of the first memory bank, UPPER BANK and the transmission lines D1, D2, D3 and D4 of the second memory bank, LOWER BANK have the same column location information.

As described above, the semiconductor memory device of the prior art includes write drivers whose number is the same as that of transmission lines of each memory bank and thus an area occupied by the write drivers is very great.

FIG. 2 illustrates a write driver of the prior art.

Referring to FIG. 2, the write driver includes a write control block 21 for generating drive control signals LAT, LATB, DRV and DRVB corresponding to write data DIN and DINB, and a write drive block 22 for driving transmission lines LIO and LIOB of a memory bank in response to the drive control signals LAT, LATB, DRV and DRVB.

The detailed construction and major operations of the write driver will be described hereinafter.

The write control block 21 includes an enable signal generating sector 210 for generating a drive enable signal BWENP in response to a write signal BWEN and a write mask signal WDM, and a drive control signal generating sector 220 for generating the drive control signals LAT, LATB, DRV and DRVB corresponding to the write data DIN and DINB in response to the drive enable signal BWENP.

Herein, the enable signal generating sector 210 includes a first inverter INV1 to receive the write signal BWEN, a second inverter INV2 to receive the write mask signal WDM, a switching unit TG for selectively outputting an output signal of the second inverter INV2 in response to the write signal BWEN, a latching unit 211 for storing an output signal of the switching unit TG and a logical combining unit NOR1 for generating the drive enable signal BWENP by performing a NOR operation on output signals of the first inverter INV1 and the latching unit 211.

When the write signal BWEN has a low level, the switching unit TG is turned on and thus the latching unit 211 stores the write mask signal WDM to determine whether to perform a mask operation. If the write signal BWEN is enabled to a high level and the write mask signal WDM has a low level, the drive enable signal BWENP generated from the logical combining unit NOR1 is enabled to a high level, thereby activating the drive control signal generating sector 220.

Furthermore, the drive control signal generating sector 220 includes a cross couple latch amplifier 221 for receiving the write data DIN and DINB of a differential type and outputting the drive control signals LAT, LATB, DRV and DRVB through its differential output nodes N1 and N2. The drive control signal generating sector 220 further includes a precharging unit 222 for precharging the differential output nodes N1 and N2 in response to the drive enable signal BWENP. That is, the cross couple latch amplifier 221 includes loading elements MP1, MP2, MN1 and MN2 connected between a supply voltage (VDD) terminal and differential input elements MN3 and MN4 and controlled by voltage levels of the differential output nodes N1 and N2, a first inverter, INV1, and a second inverter, INV2, to receive the drive control signals LAT and LATB outputted through the differential output nodes N1 and N2, respectively, the differential input elements MN3 and MN4 to receive the write data DIN and DINB of a differential type, and a bias element MN5 for providing a bias current to the differential input elements MN3 and MN4 in response to the drive enable signal BWENP. In addition, the precharging unit 222 includes a plurality of PMOS transistors MP11, MP12 and MP13 for providing a precharge voltage VDD to the differential output nodes N1 and N2 under the control of the drive enable signal BWENP.

First of all, if the drive enable signal BWENP has a low level, the bias element MN5 does not provide the bias current to the differential input elements MN3 and MN4 and thus the cross couple latch amplifier 221 is not activated. As a result, the PMOS transistors MP11, MP12 and MP13 of the precharging unit 222 are turned on in response to the drive enable signal BWENP so that the differential output nodes N1 and N2 are precharged with the precharge voltage VDD.

Then, if the drive enable signal BWENP becomes to have a high level, the precharge operation on the differential output nodes N1 and N2 of the precharging unit 222 is terminated and the cross couple latch amplifier 221 outputs the drive control signals LAT, LATB, DRV and DRVB corresponding to the write data DIN and DINB inputted thereto.

The write drive block 22 includes differential driving sectors 230 and 240 for differentially driving a positive and a negative transmission line LIO and LIOB of the memory bank in response to the drive control signals LAT, LATB, DRV and DRVB, and a transmission line precharging sector 250 for precharging the positive transmission line, LIO and the negative transmission line, LIOB of the memory bank in response to a precharge signal LIOPCG.

The write drive block 22 precharges the positive transmission line LIO and the negative transmission line LIOB with a precharge voltage VPRE if the precharge signal LIOPCG has a high level. Then, if the precharge signal LIOPCG has a low level and the drive control signals LAT, LATB, DRV and DRVB are enabled, the positive transmission line LIO and the negative transmission line LIOB are differentially driven according to the drive control signals LAT, LATB, DRV and DRVB.

As described above, since the prior art should include write drivers whose number is identical to the number of transmission lines of each memory bank, the write drivers occupy a large area. Therefore, technology for resolving the above problem is required.

SUMMARY OF THE INVENTION

An embodiment of the present invention is directed to providing a semiconductor memory device reducing the whole area occupied by its internal circuits by including a common write driver that selectively drives write data to neighboring memory banks.

Another embodiment of the present invention is directed to providing a write driver for selectively driving transmission lines of a plurality of memory banks through a common write control block and a common write drive block, or controlling a plurality of write driving blocks with a common write control block.

In accordance with an aspect of the present invention, there is provided a semiconductor memory device including: a first memory bank and a second memory bank; and a common write block configured to drive write data to an activated memory bank of the first memory bank and the second memory bank.

In accordance with another aspect of the present invention, there is provided a write driver of a semiconductor memory device, the write driver including: a common write control block configured to generate common drive control signals corresponding to write data; a drive selection block configured to receive the common drive control signals and output a first and a second drive control signal selectively enabled in response to a bank selection signal; a first write drive block configured to drive transmission lines of a first memory bank in response to the first drive control signal; and a second write drive block configured to drive transmission lines of a second memory bank in response to the second drive control signal.

In accordance with another aspect of the present invention, there is provided a write driver of a semiconductor memory device, the write driver including: a common write control block configured to generate common drive control signals corresponding to write data; a first write drive block configured to selectively drive transmission lines of a first memory bank in response to the common drive control signals and a bank selection signal; and a second write drive block configured to selectively drive transmission lines of a second memory bank in response to the common drive control signals and the bank selection signal.

In accordance with another aspect of the present invention, there is provided a write driver of a semiconductor memory device, the write driver including: a common write control block configured to generate common drive control signals corresponding to write data; and a common write drive block configured to drive transmission lines of a first memory bank or transmission lines of a second memory bank that are selected by a bank selection signal in response to the common drive control signals.

The semiconductor memory device in accordance with an embodiment of the present invention includes a common write driver to drive write data to one of a first memory bank and a second memory bank that is activated. That is to say, since the semiconductor memory device drives the write data using the common write driver commonly used without including a write driver for each of the first memory bank and the second memory bank, it is possible to reduce the size of the semiconductor memory device. Furthermore, since the write driver in accordance with an embodiment of the present invention can selectively drive transmission lines of the memory bank assigned to a plurality of write drive blocks by controlling the plurality of write driver blocks with a common write control block, or selectively drive transmission lines of a plurality of memory banks using a common write control block and a common write drive block, it is possible to reduce an area occupied by the write driver.

BRIEF DESCRIPTION OF THE DRAWINGS

Features of the present invention will become apparent to those skilled in the art from the following description with reference to the figures, in which.

DESCRIPTION OF SPECIFIC EMBODIMENTS

Other objects and advantages of the present invention can be understood by the following description, and become apparent with reference to the embodiments of the present invention. For reference, in drawings and description, since terms, symbols, marks and so on used to name devices, blocks and so on may be transcribed by detailed units according to needs, the same terms, symbols and marks may not name the same devices over circuits.

In general, a logic signal of a circuit is classified into a high level and a low level according to its voltage level and represented as '1' or '0'. Moreover, according to needs, the logic signal may have a high impedance (Hi-Z) state. In the embodiments of the present invention, a p-channel metal oxide semiconductor (PMOS) and an n-channel metal oxide semiconductor (NMOS) are kinds of a metal oxide semiconductor field-effect transistor (MOSFET).

Figure 1:
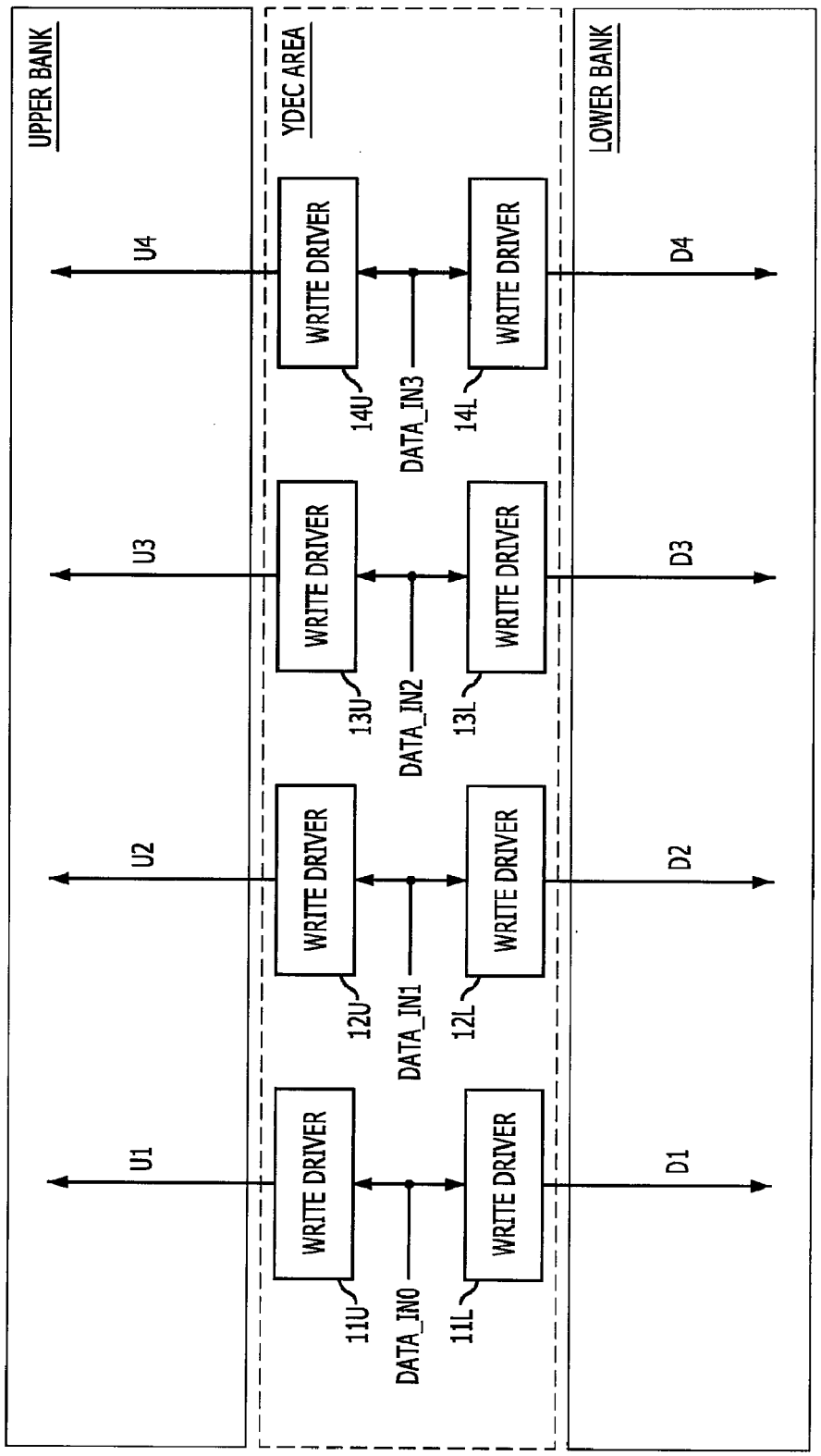
FIG. 1 illustrates a semiconductor memory device of the prior art.
Figure 2:
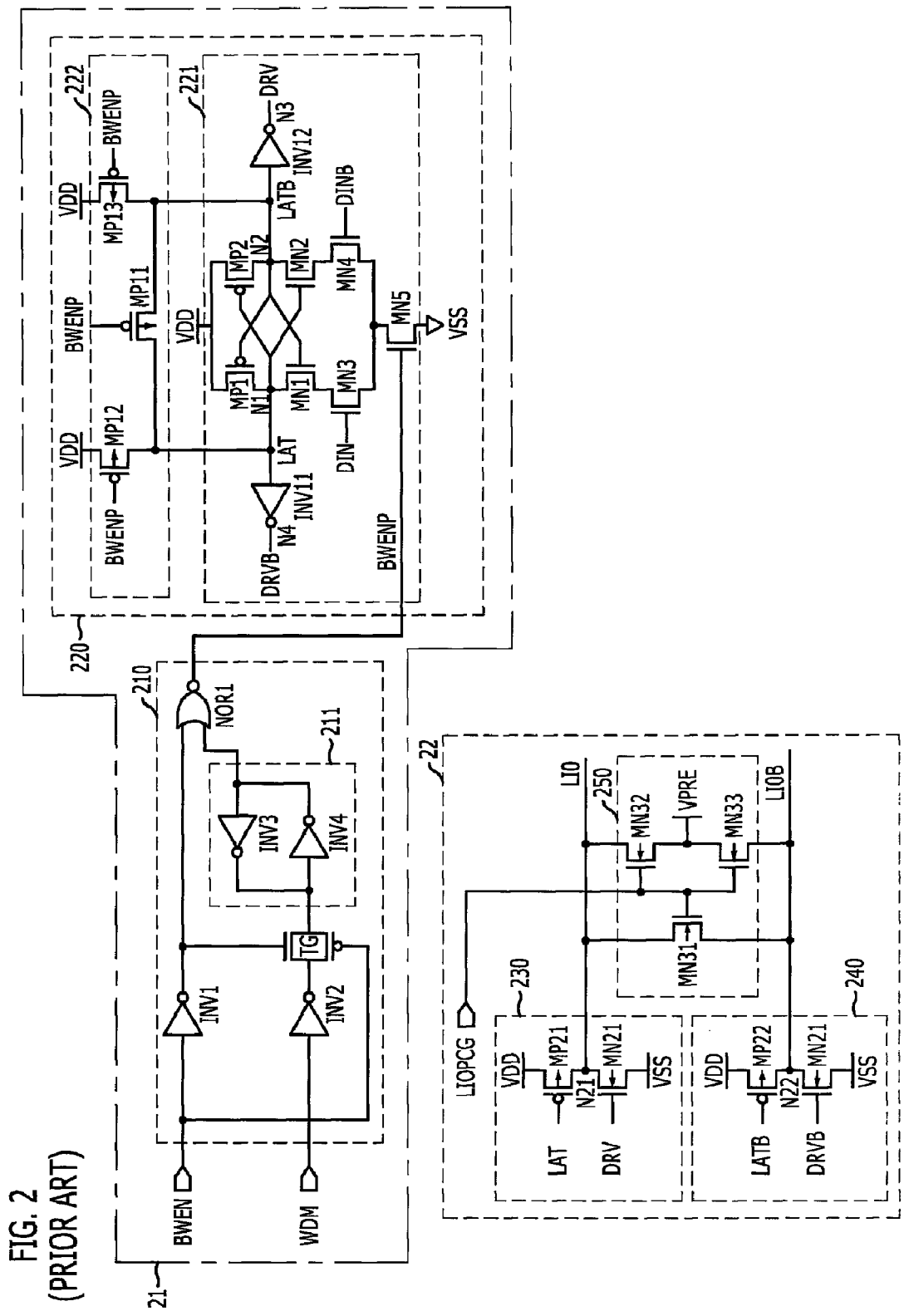
FIG. 2 illustrates a write driver of the prior art.
Figure 3:
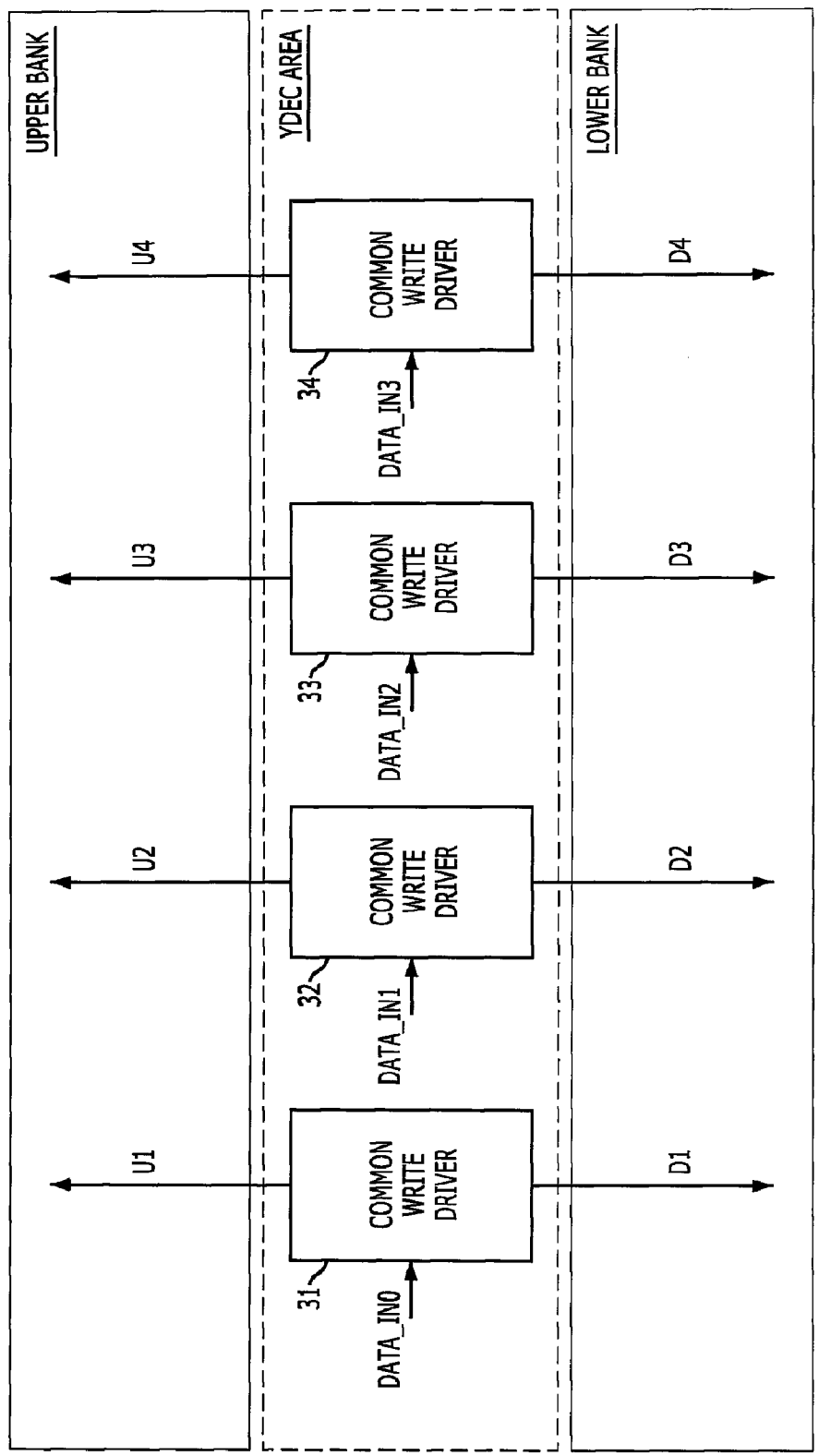
FIG. 3 illustrates a semiconductor memory device in accordance with an embodiment of the present invention.

FIG. 3 illustrates a semiconductor memory device in accordance with an embodiment of the present invention.

Referring to FIG. 3, the semiconductor memory device includes a first memory bank, UPPER BANK and a second memory bank, LOWER BANK, and a plurality of common write drivers 31, 32, 33 and 34 for driving a multiplicity of write data DATA_IN0, DATA_IN1, DATA_IN2 and DATA_IN3 to an activated memory bank of the first memory bank, UPPER BANK, and the second memory bank, LOWER BANK.

The plurality of common write drivers 31, 32, 33 and 34 are disposed in a common column decoding area YDEC AREA between the first memory bank, UPPER BANK and the second memory bank, LOWER BANK. For reference, the first memory bank, UPPER BANK, and the second memory bank, LOWER BANK, are selectively activated by a bank selection signal. Moreover, each of the plurality of common write drivers 31, 32, 33 and 34 includes a common write control sector for controlling corresponding write data DATA_IN to be driven to the activated memory bank.

The detailed construction and major operations of the semiconductor memory device depicted above will be described hereinafter.

The plurality of common write drivers 31, 32, 33 and 34 transmit the multiplicity of write data DATA_IN0, DATA_IN1, DATA_IN2 and DATA_IN3 to memory cells within a corresponding memory bank through transmission lines U1, U2, U3 and U4 of the first memory bank, UPPER BANK or transmission lines D1, D2, D3 and D4 of the second memory bank, LOWER BANK. For reference, the transmission lines U1, U2, U3 and U4 of the first memory bank, UPPER BANK and the transmission lines D1, D2, D3 and D4 of the second memory bank, LOWER BANK have the same column location information.

In general, the write drivers are assigned to each memory bank. However, this embodiment includes common write drivers capable of commonly driving the transmission lines of the first memory bank, UPPER BANK, and the second memory bank, LOWER BANK, and thus can reduce an area of circuits included in the common column decoding area YDEC AREA.

Each of the plurality of common write drivers 31, 32, 33 and 34 has the same structure. Hereinafter, the first common write driver 31 is described as a representative one. The first common write driver 31 selectively drives the first write data DATA_IN0 to the first transmission line U1 of the first memory bank, UPPER BANK or the first transmission line D1 of the second memory bank, LOWER BANK. Since any one of the first memory bank, UPPER BANK and the second memory bank, LOWER BANK is selectively activated, the write data DATA_IN0 is driven to the activated memory bank UPPER BANK or LOWER BANK.

Figure 4:
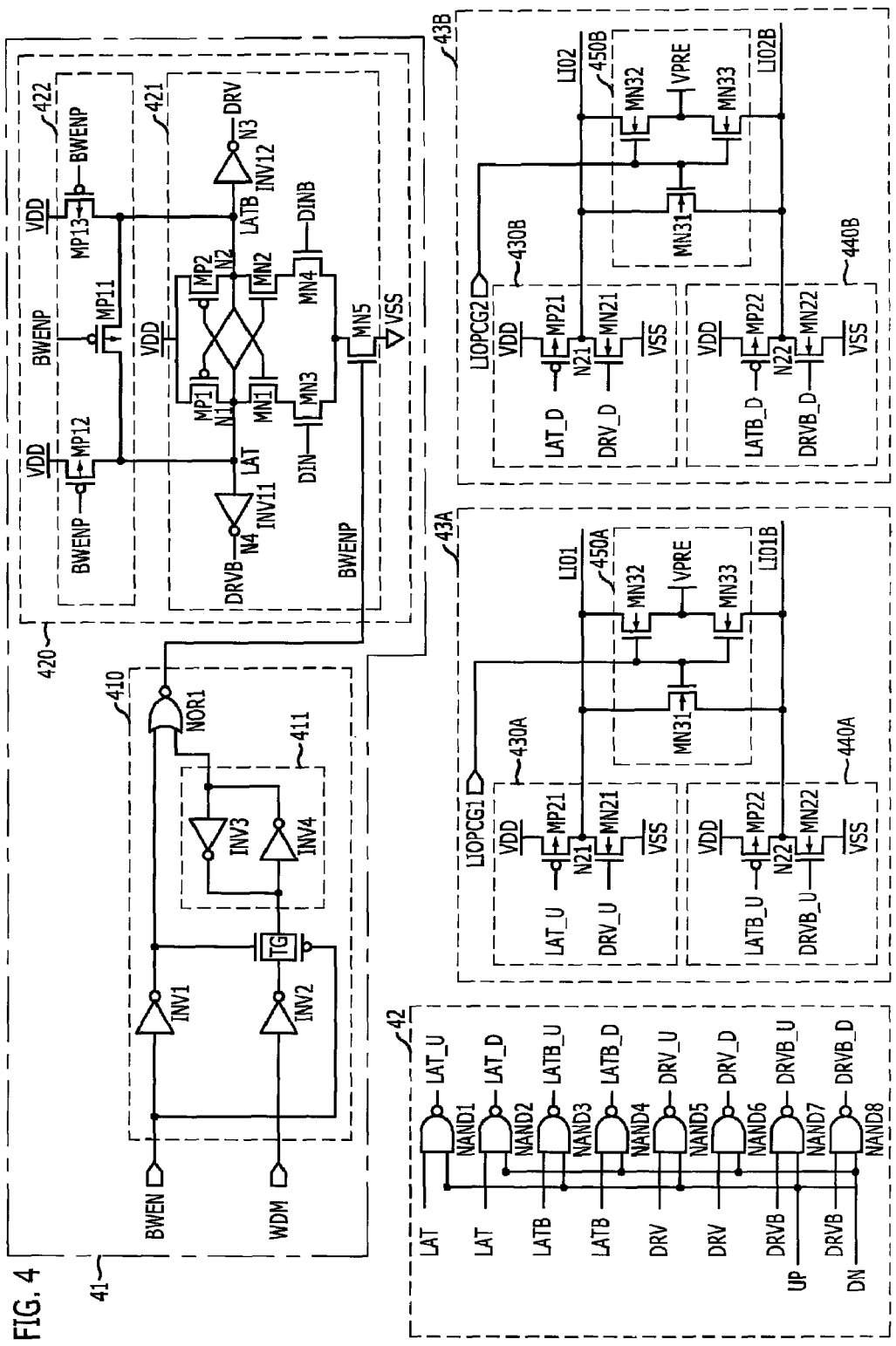
FIG. 4 illustrates a write driver in accordance with a first embodiment of the present invention.

FIG. 4 illustrates a write driver in accordance with a first embodiment of the present invention.

Referring to FIG. 4, the write driver includes a common write control block 41 for generating common drive control signals LAT, LATB, DRV and DRVB corresponding to write data DIN and DINB, a drive selection block 42 for outputting first drive control signals LAT_U, LATB_U, DRV_U and DRVB_U and second drive control signals LAT_D, LATB_D, DRV_D and DRVB_D selectively enabled in response to bank selection signals UP and DN after receiving the common drive control signals LAT, LATB, DRV and DRVB, a first write drive block 43A for driving transmission lines LIO1 and LIO1B of a first memory bank in response to the first drive control signals LAT_U, LATB_U, DRV_U and DRVB_U, and a second write drive block 43B for driving transmission lines LIO2 and LIO2B of a second memory bank in response to the second drive control signals LAT_D, LATB_D, DRV_D and DRVB_D. For reference, the transmission lines LIO1 and LIO1B of the first memory bank and the transmission lines LIO2 and LIO2B of the second memory bank have the same column location information.

The detailed construction and major operations of the write driver depicted above will be described hereinafter.

The common write control block 41 includes an enable signal generating sector 410 for generating a drive enable signal BWENP in response to a write signal BWEN and a write mask signal WDM, and a drive control signal generating sector 420 for generating the common drive control signals LAT, LATB, DRV and DRVB corresponding to the write data DIN and DINB in response to the drive enable signal BWENP.

The enable signal generating sector 410 includes a first inverter INV1 to receive the write signal BWEN, a second inverter INV2 to receive the write mask signal WDM, a switching unit TG for selectively outputting an output signal of the second inverter INV2 in response to the write signal BWEN, a latching unit 411 for storing an output signal of the switching unit TG, and a logical combining unit NOR1 for generating the drive enable signal BWENP by performing a NOR operation on output signals of the first inverter INV1 and the latching unit 411. In this embodiment, the switching unit TG includes a transmission gate.

When the write signal BWEN has a low level, the switching unit TG is turned on and thus the latching unit 411 stores the write mask signal WDM to determine whether or not performing a mask operation. If the write signal BWEN is enabled to a high level and the write mask signal WDM has a low level, the drive enable signal BWENP generated from the logical combining unit NOR1 is enabled to a high level, so that the drive control signal generating sector 420 is activated.

The drive control signal generating sector 420 includes a cross couple latch amplifier 421 for receiving the write data DIN and DINB of a differential type and outputting the common drive control signals LAT, LATB, DRV and DRVB through its differential output nodes N1 and N2. For reference, as shown in this embodiment, the drive control signal generating sector 420 further includes a precharging unit 422 for precharging the differential output nodes N1 and N2 in response to the drive enable signal BWENP. That is, the cross couple latch amplifier 421 includes loading elements MP1, MP2, MN1 and MN2 connected between a supply voltage (VDD) terminal and differential input elements MN3 and MN4 and controlled by voltage levels of the differential output nodes N1 and N2, a first inverter INV1 and a second inverter INV2 for receiving the common drive control signals LAT and LATB outputted through the differential output nodes N1 and N2, respectively, the differential input elements MN3 and MN4 for receiving the write data DIN and DINB of a differential type, and a bias element MN5 for providing a bias current to the differential input elements MN3 and MN4 in response to the drive enable signal BWENP. Meanwhile, the precharging unit 422 includes a plurality of PMOS transistors MP11, MP12 and MP13 for providing a precharge voltage VDD to the differential output nodes N1 and N2 under the control of the drive enable signal BWENP.

First of all, if the drive enable signal BWENP has a low level, the bias element MN5 does not provide the bias current to the differential input elements MN3 and MN4 and thus the cross couple latch amplifier 421 is not activated. As a result, the PMOS transistors MP11, MP12 and MP13 of the precharging unit 422 are turned on by the drive enable signal BWENP so that the differential output nodes N1 and N2 are precharged with the precharge voltage VDD.

Then, if the drive enable signal BWENP has a high level, the precharge operation on the differential output nodes N1 and N2 of the precharging unit 422 is terminated and the cross couple latch amplifier 421 outputs the common drive control signals LAT, LATB, DRV and DRVB corresponding to the write data DIN and DINB inputted thereto.

The drive selection block 42 includes a first logical combining sector NAND1, NAND3, NAND5 and NAND7 for generating the first drive control signals LAT_U, LATB_U, DRV_U and DRVB_U, respectively, by performing a NAND operation on the common drive control signals LAT, LATB, DRV and DRVB and the first bank selection signal UP, and a second logical combining sector NANA2, NAND4, NAND6 and NAND8 for generating the second drive control signals LAT_D, LATB_D, DRV_D and DRVB_D, respectively, by performing a NAND operation on the common drive control signals LAT, LATB, DRV and DRVB and the second bank selection signal DN.

If the first bank selection signal UP has a high level, the first drive control signals LAT_U, LATB_U, DRV_U and DRVB_U are enabled in response to the common drive control signals LAT, LATB, DRV and DRVB. Meanwhile, if the second bank selection signal DN has a high level, the second drive control signals LAT_D, LATB_D, DRV_D and DRVB_D are enabled in response to the common drive control signals LAT, LATB, DRV and DRVB.

The first write drive block 43A includes differential driving sectors 430A and 440A for differentially driving the positive transmission line LIO1 and the negative transmission line LIO1B of the first memory bank in response to the first drive control signals LAT_U, LATB_U, DRV_U and DRVB_U. In addition, the first write drive block 43A may include a transmission line precharging sector 450A for precharging the positive transmission line LIO1 and the negative transmission line LIO1B of the first memory bank in response to a precharge signal LIOPCG1. Herein, the transmission line precharging sector 450A includes a plurality of NMOS transistors MN31, MN32 and MN33 for providing a precharge voltage VPRE to the positive transmission line LIO1 and the negative transmission line LIO1B of the first memory bank under the control of the precharge signal LIOPCG1.

The second write drive block 43B includes differential driving sectors 430B and 440B for differentially driving the positive transmission line LIO2 and the negative transmission line LIO2B of the second memory bank in response to the second drive control signals LAT_D, LATB_D, DRV_D and DRVB_D. In addition, the second write drive block 43B may include a transmission line precharging sector 450B for precharging the positive transmission line LIO2 and the negative transmission line LIO2B of the second memory bank in response to a precharge signal LIOPCG2. Herein, the transmission line precharging sector 450B includes a plurality of NMOS transistors MN31, MN32 and MN33 for providing the precharge voltage VPRE to the positive transmission line LIO2 and the negative transmission line LIO2B of the second memory bank under the control of the precharge signal LIOPCG2.

The differential driving sectors 430A, 440A, 430B and 440B of the first write drive block 43A and the second write drive block 43B selectively and differentially drive the transmission lines LIO1 and LIO1B of the first memory bank or the transmission lines LIO2 and LIO2B of the second memory bank under the control of the first drive control signals LAT_U, LATB_U, DRV_U and DRVB_U and the second drive control signals LAT_D, LATB_D, DRV_D and DRVB_D outputted from the drive selection block 42. That is, if the first drive control signals LAT_U, LATB_U, DRV_U and DRVB_U are enabled in the drive selection block 42, the transmission lines LIO1 and LIO1B of the first memory bank are driven according to the first drive control signals LAT_U, LATB_U, DRV_U and DRVB_U, and, if the second drive control signals LAT_D, LATB_D, DRV_D and DRVB_D are enabled, the transmission lines LIO2 and LIO2B of the second memory bank are driven according to the second drive control signals LAT_D, LATB_D, DRV_D and DRVB_D. Furthermore, since the first write drive block 43A and the second write drive block 43B include the transmission line precharging sectors 450A and 450B, respectively, if a corresponding precharge signal LIOPCG1 or LIOPCG2 is enabled to a high level, the NMOS transistors MN31, MN32 and MN33 are turned on and thus the transmission line pair LIO1 and LIO1B or LIO2 and LIO2B is precharged with the precharge voltage VPRE.

Figure 5:
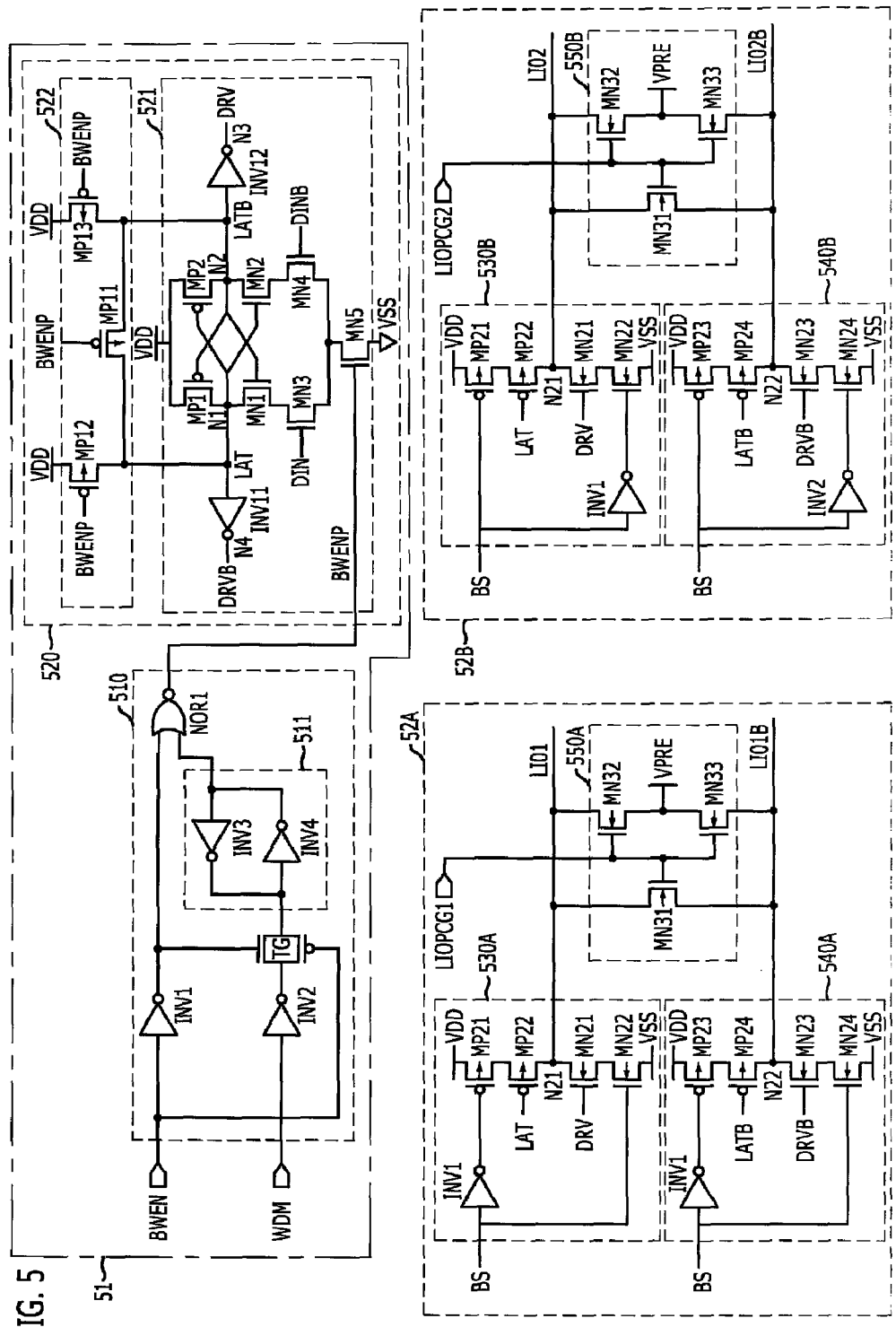
FIG. 5 illustrates a write driver in accordance with a second embodiment of the present invention.

FIG. 5 illustrates a write driver in accordance with a second embodiment of the present invention.

Referring to FIG. 5, the write driver includes a common write control block 51 for generating common drive control signals LAT, LATB, DRV and DRVB corresponding to write data DIN and DINB, a first write drive block 52A for selectively driving transmission lines LIO1 and LIO1B of a first memory bank in response to the common drive control signals LAT, LATB, DRV and DRVB and a bank selection signal BS, and a second write drive block 52B for selectively driving transmission lines LIO2 and LIO2B of a second memory bank in response to the common drive control signals LAT, LATB, DRV and DRVB and the bank selection signal BS. For reference, the transmission lines LIO1 and LIO1B of the first memory bank and the transmission lines LIO2 and LIO2B of the second memory bank have the same column location information.

The detailed construction and major operations of the write driver depicted above will be described hereinafter.

The common write control block 51 includes an enable signal generating sector 510 for generating a drive enable signal BWENP in response to a write signal BWEN and a write mask signal WDM, and a drive control signal generating sector 520 for generating the common drive control signals LAT, LATB, DRV and DRVB corresponding to the write data DIN and DINB in response to the drive enable signal BWENP.

The enable signal generating sector 510 includes a first inverter INV1 for receiving the write signal BWEN, a second inverter INV2 for receiving the write mask signal WDM, a switching unit TG for selectively outputting an output signal of the second inverter INV2 in response to the write signal BWEN, a latching unit 511 for storing an output signal of the switching unit TG, and a logical combining unit NOR1 for generating the drive enable signal BWENP by performing a NOR operation on output signals of the first inverter INV1 and the latching unit 511. In this embodiment, the switching unit TG includes a transmission gate.

When the write signal BWEN has a low level, the switching unit TG is turned on and thus the latching unit 511 stores the write mask signal WDM to determine whether or not performing a mask operation. If the write signal BWEN is enabled to a high level and the write mask signal WDM has a low level, the drive enable signal BWENP generated from the logical combining unit NOR1 is enabled to a high level, so that the drive control signal generating sector 520 is activated.

The drive control signal generating sector 520 includes a cross couple latch amplifier 521 for receiving the write data DIN and DINB of a differential type and outputting the common drive control signals LAT, LATB, DRV and DRVB through its differential output nodes N1 and N2. For reference, as shown in this embodiment, the drive control signal generating sector 520 further includes a precharging unit 522 for precharging the differential output nodes N1 and N2 in response to the drive enable signal BWENP. That is, the cross couple latch amplifier 521 includes loading elements MP1, MP2, MN1 and MN2 connected between a VDD terminal and differential input elements MN3 and MN4 and controlled by voltage levels of the differential output nodes N1 and N2, a first inverter INV1 and a second inverterINV2 for receiving the common drive control signals LAT and LATB outputted through the differential output nodes N1 and N2, respectively, the differential input elements MN3 and MN4 for receiving the write data DIN and DINB of the differential type, and a bias element MN5 for providing a bias current to the differential input elements MN3 and MN4 in response to the drive enable signal BWENP. In addition, the precharging unit 522 includes a plurality of PMOS transistors MP11, MP12 and MP13 for providing a precharge voltage VDD to the differential output nodes N1 and N2 under the control of the drive enable signal BWENP.

First of all, if the drive enable signal BWENP has a low level, the bias element MN5 does not provide the bias current to the differential input elements MN3 and MN4 and thus the cross couple latch amplifier 521 is not activated. As a result, the PMOS transistors MP11, MP12 and MP13 of the precharging unit 522 are turned on by the drive enable signal BWENP so that the differential output nodes N1 and N2 are precharged with the precharge voltage VDD.

Then, if the drive enable signal BWENP has a high level, the precharge operation on the differential output nodes N1 and N2 of the precharging unit 522 is terminated and the cross couple latch amplifier 521 outputs the common drive control signals LAT, LATB, DRV and DRVB corresponding to the write data DIN and DINB inputted thereto.

The first write drive block 52A includes differential driving sectors 530A and 540A for differentially driving the positive transmission line LIO1 and the negative transmission line LIO1B of the first memory bank in response to the common drive control signals LAT, LATB, DRV and DRVB and the bank selection signal BS. In addition, the first write drive block 52A may include a transmission line precharging sector 550A for precharging the positive transmission line LIO1 and the negative transmission line LIO1B of the first memory bank in response to a precharge signal LIOPCG1. Herein, the transmission line precharging sector 550A includes a plurality of NMOS transistors MN31, MN32 and MN33 for providing a precharge voltage VPRE to the positive transmission line LIO1 and the negative transmission line LIO1B of the first memory bank under the control of the precharge signal LIOPCG1.

The second write drive block 52B includes differential driving sectors 530B and 540B for differentially driving the positive transmission line LIO2 and the negative transmission line LIO2B of the second memory bank in response to the common drive control signals LAT, LATB, DRV and DRVB and the bank selection signal BS. In addition, the second write drive block 52B may further include a transmission line precharge sector 550B for precharging the positive transmission line LIO2 and the negative transmission line LIO2B of the second memory bank in response to a precharge signal LIOPCG2. Herein, the transmission line precharging sector 550B includes a plurality of NMOS transistors MN31, MN32 and MN33 for providing the precharge voltage VPRE to the positive transmission line LIO2 and the negative transmission line LIO2B of the second memory bank under the control of the precharge signal LIOPCG2.

The differential driving sectors 530A, 540A, 530B and 540B of the first write drive block 52A and the second write drive block 52B selectively and differentially drive the transmission lines LIO1 and LIO1B of the first memory bank or the transmission lines LIO2 and LIO2B of the second memory bank under the control of the common drive control signals LAT, LATB, DRV and DRVB and the bank selection signal BS. That is, if the bank selection signal BS has a high level, the transmission lines LIO1 and LIO1B of the first memory bank are driven according to the common drive control signals LAT, LATB, DRV and DRVB, and, if the bank selection signal BS has a low level, the transmission lines LIO2 and LIO2B of the second memory bank are driven according to the common drive control signals LAT, LATB, DRV and DRVB. Furthermore, since the first write drive block 52A and the second write drive block 52B include the transmission line precharging sectors 550A and 550B, respectively, if a corresponding precharge signal LIOPCG1 or LIOPCG2 is enabled to a high level, the NMOS transistors MN31, MN32 and MN33 are turned on and thus the transmission line pair LIO1 and LIO1B, or LIO2 and LIO2B is precharged with the precharge voltage VPRE.

Figure 6:
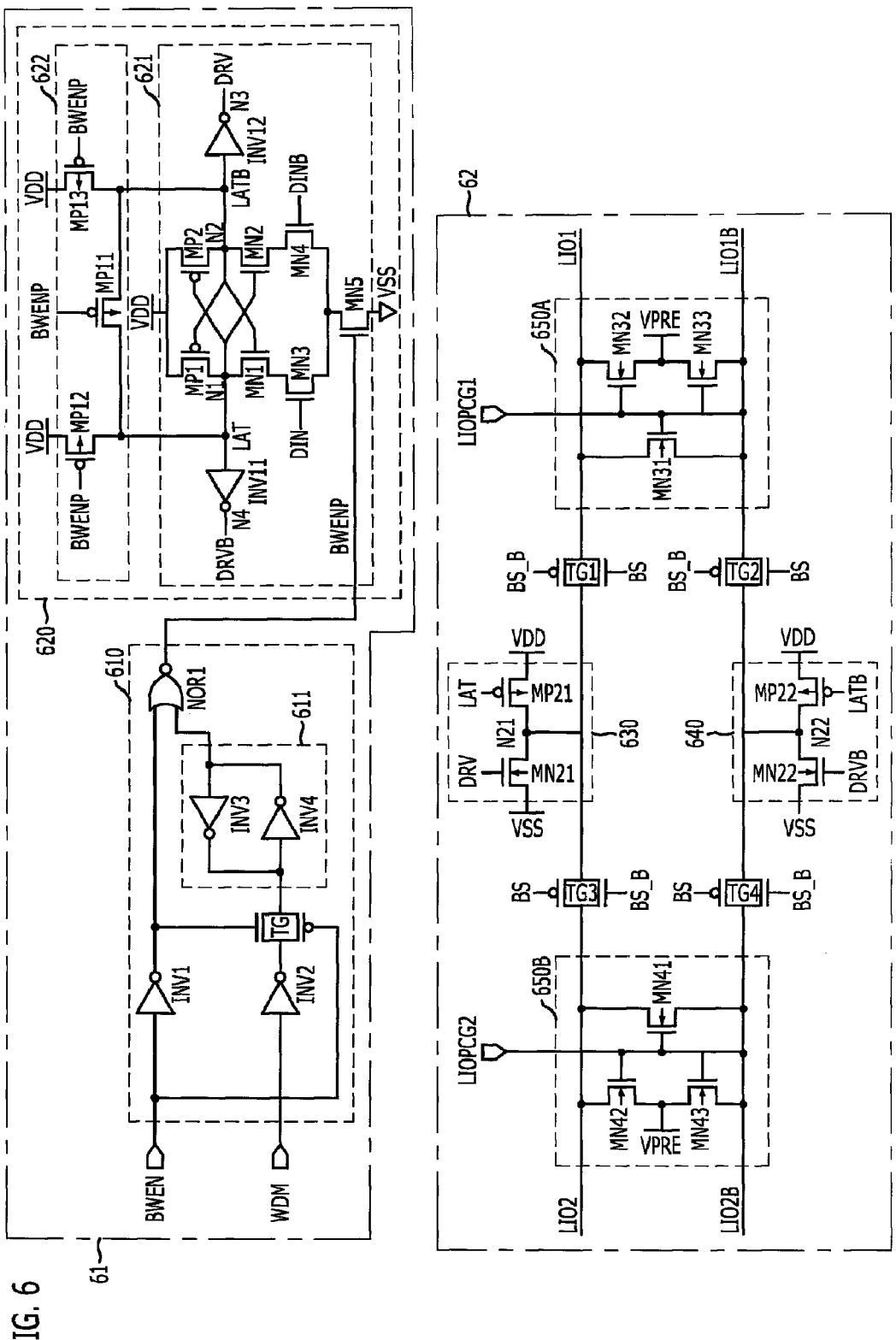
FIG. 6 illustrates a write driver in accordance with a third embodiment of the present invention.

FIG. 6 illustrates a write driver in accordance with a third embodiment of the present invention.

Referring to FIG. 6, the write driver includes a common write control block 61 for generating common drive control signals LAT, LATB, DRV and DRVB corresponding to write data DIN and DINB, and a common write drive block 62 for driving transmission lines LIO1 and LIOB of a first memory bank or transmission lines LIO2 and LIO2B of a second memory bank selected by bank selection signals BS or BS_B in response to the common drive control signals LAT, LATB, DRV and DRVB. For reference, the transmission lines LIO1 and LIO1B of the first memory bank and the transmission lines LIO2 and LIO2B of the second memory bank have the same column location information.

The detailed construction and major operations of the write driver depicted above will be described hereinafter.

The common write control block 61 includes an enable signal generating sector 610 for generating a drive enable signal BWENP in response to a write signal BWEN and a write mask signal WDM, and a drive control signal generating sector 620 for generating the common drive control signals LAT, LATB, DRV and DRVB corresponding to the write data DIN and DINB in response to the write enable signal BWENP.

The enable signal generating sector 610 includes a first inverter INV1 for receiving the write signal BWEN, a second inverter INV2 for receiving the write mask signal WDM, a switching unit TG for selectively outputting an output signal of the second inverter INV2 in response to the write signal BWEN, a latching unit 611 for storing an output signal of the switching unit TG, and a logical combining unit NOR1 for generating the drive enable signal BWENP by performing a NOR operation on output signals of the first inverter INV1 and the latching unit 611. In this embodiment, the switching unit TG includes a transmission gate.

When the write signal BWEN has a low level, the switching unit TG is turned on and thus the latching unit 611 stores the write mask signal WDM to determine whether or not performing a mask operation. If the write signal BWEN is enabled to a high level and the write mask signal WDM has a low level, the drive enable signal BWENP generated from the logical combining unit NOR1 is enabled to a high level, so that the drive control signal generating sector 620 is activated.

The drive control signal generating sector 620 includes a cross couple latch amplifier 621 for receiving the write data DIN and DINB of a differential type and outputting the common drive control signals LAT, LATB, DRV and DRVB through its differential output nodes N1 and N2. For reference, as shown in this embodiment, the drive control signal generating sector 620 further includes a precharging unit 622 for precharging the differential output nodes N1 and N2 in response to the drive enable signal BWENP. That is, the cross couple latch amplifier 621 includes loading elements MP1, MP2, MN1 and MN2 connected between a VDD terminal and differential input elements MN3 and MN4 and controlled by voltage levels of the differential output nodes N1 and N2, a first inverter INV1 and a second inverter INV2 for receiving the common drive control signals LAT and LATB outputted through the differential output nodes N1 and N2, respectively, the differential input elements MN3 and MN4 for receiving the write data DIN and DINB of the differential type, and a bias element MN5 for providing a bias current to the differential input elements MN3 and MN4 in response to the drive enable signal BWENP. In addition, the precharging unit 622 includes a plurality of PMOS transistors MP11, MP12 and MP13 for providing a precharge voltage VDD to the differential output nodes N1 and N2 under the control of the drive enable signal BWENP.

First of all, if the drive enable signal BWENP has a low level, the bias element MN5 does not provide the bias current to the differential input elements MN3 and MN4 and thus the cross couple latch amplifier 621 is not activated. As a result, the PMOS transistors MP11, MP12 and MP13 of the precharging unit 622 are turned on by the drive enable signal BWENP so that the differential output nodes N1 and N2 are precharged with the precharge voltage VDD.

Then, if the drive enable signal BWENP has a high level, the precharge operation on the differential output nodes N1 and N2 of the precharge unit 622 is terminated and the cross couple latch amplifier 621 outputs the common drive control signals LAT, LATB, DRV and DRVB corresponding to the write data DIN and DINB inputted thereto.

The common write drive block 62 includes differential driving sectors 630 and 640 for differentially driving a first output node N21 and a second output node N22, respectively, in response to the common drive control signals LAT, LATB, DRV and DRVB, and a switching sector TG1, TG2, TG3 and TG4 for selectively transferring signals on the first and second output nodes N21 and N22 to the positive transmission line LIO1 and the negative transmission line LIO1B of the first memory bank or the positive transmission line LIO2 and the negative transmission line LIO2B of the second memory bank in response to the bank selection signals BS and BS_B. Moreover, for reference, the common write drive block 62 may include a first transmission line precharging sector 650A for precharging the positive transmission line LIO1 and the negative transmission line LIO1B of the first memory bank in response to a first precharge signal LIOPCG1, and a second transmission line precharging sector 650B for precharging the positive transmission line LIO2 and the negative transmission line LIO2B of the second memory bank in response to a second precharge signal LIOPCG2. Herein, the first transmission line precharging sector 650A includes a plurality of NMOS transistors MN31, MN32 and MN33 for providing a precharge voltage VPRE to the positive transmission line LIO1 and the negative transmission line LIO1B of the first memory bank under the control of the first precharge signal LIOPCG1. In the meantime, the second transmission line precharging sector 650B includes a plurality of NMOS transistors MN41, MN42 and MN43 for providing the precharge voltage VPRE to the positive transmission line LIO2 and the negative transmission line LIO2B of the second memory bank under the control of the second precharge signal LIOPCG2.

The common write drive block 62 differentially drives the first and second output nodes N21 and N22 under the control of the common drive control signals LAT, LATB, DRV and DRVB. At this time, the first switches TG1 and TG2 or the second switches TG3 and TG4 of the switching sector TG1, TG2, TG3 and TG4 are selectively turned on by the bank selection signals BS and BS_B. If the first switches TG1 and TG2 are turned on, signals driven on the first and second output nodes N21 and N22 are transferred to the transmission lines LIO1 and LIO1B of the first memory bank. On the other hand, if the second switches TG3 and TG4 are turned on, the signals driven on the first and second output nodes N21 and N22 are transferred to the transmission lines LIO2 and LIO2B of the second memory bank. In the first and second transmission line precharging sectors 650A and 650B assigned to the transmission lines of the first memory bank and the second memory bank, respectively, if the corresponding precharge signals LIOPCG1 and LIOPCG2 are enabled to a high level, the NMOS transistors MN31, MN32, MN33, MN41, MN42 and MN43 are turned on and thus the transmission pairs LIO1 and LIO1B, and LIO2 and LIO2B are precharged with the precharge voltage VPRE.

In the write driver of the third embodiment, both the write control block and the write drive block are constructed as common circuits. Therefore, the write driver of the third embodiment occupies the smallest area compared to those of the first and second embodiments and thus it is the most advantageous in an aspect of 'NET DIE'.

In accordance with the present invention, since the plurality of memory banks are selectively driven using the common write driver, it is possible to save an area for the write driver. That is, since the write driver includes the write control block and the write drive block, it is possible to reduce the size of the write driver by constructing a common circuit by combining parts of the plurality of write drivers that can be shared. Therefore, the semiconductor memory device in accordance with the present invention is more advantageous in an aspect of costs by increasing the number of semiconductor memory devices fabricated with one wafer, i.e., 'NET DIE'.

While the present invention has been described with respect to the specific embodiments, it will be apparent to those skilled in the art that various changes and modifications may be made without departing from the spirit and scope of the invention as defined in the following claims.

For instance, although it is not directly related to a technical spirit of the present invention, an embodiment including additional construction may be illustrated to explain the present invention in detail. Furthermore, the construction of active high or active low representing an active state of a signal or circuit can be changed according to embodiments. In addition, the construction of transistors to implement the same function can be changed according to needs. That is, the construction of PMOS transistors may be replaced with that of NMOS transistors and various transistors can be used according to needs. The construction of logic gates to achieve the same function can be also changed according to needs. That is, a logical product means, a logical sum means and so on may be constructed using various combinations of a NAND gate, a NOR gate and an inverter.

In particular, in these embodiments, the write data are inputted with the differential type, but it is just one example and thus it does not limit the present invention. Since there are various changes and modifications of the circuit and they are apparent to those skilled in the art, their listing is omitted herein.

What is claimed is:

1. A write driver of a semiconductor memory device, the write driver comprising:

a common write control block configured to generate common drive control signals corresponding to write data;
a drive selection block configured to receive the common drive control signals and output a first drive control signal and a second drive control signal selectively enabled in response to a bank selection signal;
a first write drive block configured to drive transmission lines of a first memory bank in response to the first drive control signal; and
a second write drive block configured to drive transmission lines of a second memory bank in response to the second drive control signal.

2. The write driver of claim 1, wherein the transmission lines of the first memory bank and the transmission lines of the second memory bank have the same column location information.

3. The write driver of claim 1, wherein the common write control block comprises:
an enable signal generating sector configured to generate a drive enable signal in response to a write signal and a write mask signal; and
a drive control signal generating sector configured to generate the common drive control signals corresponding to the write data in response to the drive enable signal.

4. The write driver of claim 3, wherein the enable signal generating sector comprises:
a first inverter to receive the write signal;
a second inverter to receive the write mask signal;
a switching unit configured to selectively output an output signal of the second inverter in response to the write signal;
a latching unit configured to store an output signal of the switching unit; and
a logical combining unit configured to generate the drive enable signal by performing a NOR operation on output signals of the first inverter and the latching unit.

5. The write driver of claim 4, wherein the switching unit comprises a transmission gate.

6. The write driver of claim 3, wherein the drive control signal generating sector comprises a cross couple latch amplifier configured to receive the write data of a differential type and output the common drive control signals to differential output nodes.

7. The write driver of claim 6, wherein the drive control signal generating sector further comprises a precharging unit configured to precharge the differential output nodes in response to the drive enable signal.

8. The write driver of claim 3, wherein the drive control signal generating sector comprises:
a loading unit connected between a supply voltage terminal and differential input nodes and under the control of voltage levels of differential output nodes;
a first inverter and a second inverter to receive signals outputted through the differential output nodes;
a differential input unit to receive the write data of a differential type; and
a bias unit configured to provide a bias current to the differential input unit in response to the drive enable signal.

9. The write driver of claim 8, wherein the drive control signal generating sector further comprises a precharging unit configured to precharge the differential output nodes in response to the drive enable signal.

10. The write driver of claim 9, wherein the precharging unit comprises a plurality of transistors to provide a precharge voltage to the differential output nodes under the control of the drive enable signal.

11. The write driver of claim 1, wherein the drive selection block comprises:
a first logical combining sector configured to generate the first drive control signal by performing a NAND operation on the common drive control signals and a first bank selection signal; and
a second logical combining sector configured to generate the second drive control signal by performing a NAND operation on the common drive control signals and a second bank selection signal.

12. The write driver of claim 1, wherein the first write drive block comprises a differential driving sector configured to differentially drive a positive transmission line of the first memory bank and a negative transmission line of the first memory bank in response to the first drive control signal.

13. The write driver of claim 12, wherein the first write drive block further comprises a transmission line precharging sector configured to precharge the positive transmission line of the first memory bank and the negative transmission line of the first memory bank in response to a precharge signal.

14. The write driver of claim 13, wherein the transmission line precharging sector comprises a plurality of transistors to provide a precharge voltage to the positive transmission line of the first memory bank and the negative transmission line of the first memory bank under the control of the precharge signal.

15. The write driver of claim 1, wherein the second write drive block comprises a differential driving sector configured to differentially drive a positive transmission line of the second memory bank and a negative transmission line of the second memory bank in response to the second drive control signal.

16. The write driver of claim 15, wherein the second write drive block further comprises a transmission line precharging sector configured to precharge the positive transmission line of the second memory bank and the negative transmission lines of the second memory bank in response to a precharge signal.

17. The write driver of claim 16, wherein the transmission line precharging sector comprises a plurality of transistors to provide a precharge voltage to the positive transmission line of the second memory bank and the negative transmission line of the second memory bank under the control of the precharge signal.

18. A write driver of a semiconductor memory device, the write driver comprising:
a common write control block configured to generate common drive control signals corresponding to write data;
a first write drive block configured to selectively drive transmission lines of a first memory bank in response to the common drive control signals and a bank selection signal; and
a second write drive block configured to selectively drive transmission lines of a second memory bank in response to the common drive control signals and the bank selection signal.

19. The write driver of claim 18, wherein the transmission lines of the first memory bank and the transmission lines of the second memory bank have the same column location information.

20. The write driver of claim 18, wherein the common write control block comprises:
an enable signal generating sector configured to generate a drive enable signal in response to a write signal and a write mask signal; and a drive control signal generating sector configured to generate the common drive control signals corresponding to the write data in response to the drive enable signal.

21. The write driver of claim 20, wherein the enable signal generating sector comprises:
- a first inverter to receive the write signal;
- a second inverter to receive the write mask signal;
- a switching unit configured to selectively output an output signal of the second inverter in response to the write signal;
- a latching unit configured to store an output signal of the switching unit; and
- a logical combining unit configured to generate the drive enable signal by performing a NOR operation on output signals of the first inverter and the latching unit.

22. The write driver of claim 21, wherein the switching unit comprises a transmission gate.

23. The write driver of claim 20, wherein the drive control signal generating sector comprises a cross couple latch amplifier configured to receive the write data of a differential type and output the common drive control signals to differential output nodes.

24. The write driver of claim 23, wherein the drive control signal generating sector further comprises a precharging unit configured to precharge the differential output nodes in response to the drive enable signal.

25. The write driver of claim 20, wherein the drive control signal generating sector comprises:
- a loading unit connected between a supply voltage terminal and differential input nodes and under the control of voltage levels of differential output nodes;
- a first inverter and a second inverter to receive signals outputted through the differential output nodes;
- a differential input unit to receive the write data of a differential type; and
- a bias unit configured to provide a bias current to the differential input unit in response to the drive enable signal.

26. The write driver of claim 25, wherein the drive control signal generating sector further comprises a precharging unit configured to precharge the differential output nodes in response to the drive enable signal.

27. The write driver of claim 26, wherein the precharging unit comprises a plurality of transistors to provide a precharge voltage to the differential output nodes under the control of the drive enable signal.

28. The write driver of claim 18, wherein the first write drive block comprises a differential driving sector configured to differentially drive a positive transmission line of the first memory bank and a negative transmission line of the first memory bank in response to the common drive control signals and the bank selection signal.

29. The write driver of claim 28, wherein the first write drive block further comprises a transmission line precharging sector configured to precharge the positive transmission line of the first memory bank and the negative transmission line of the first memory bank in response to a precharge signal.

30. The write driver of claim 29, wherein the transmission line precharging sector comprises a plurality of transistors to provide a precharge voltage to the positive transmission line of the first memory bank and the negative transmission line of the first memory bank under the control of the precharge signal.

31. The write driver of claim 18, wherein the second write drive block comprises a differential driving sector configured to differentially drive a positive transmission line of the second memory bank and a negative transmission line of the second memory bank in response to the common drive control signals and the bank selection signal.

32. The write driver of claim 31, wherein the second write drive block further comprises a transmission line precharging sector configured to precharge the positive transmission line of the second memory bank and the negative transmission line of the second memory bank in response to a precharge signal.

33. The write driver of claim 32, wherein the transmission line precharging sector comprises a plurality of transistors to provide a precharge voltage to the positive transmission line of the second memory bank and the negative transmission line of the second memory bank under the control of the precharge signal.

* * * * *